(12) United States Patent
Ohara et al.

(10) Patent No.: US 10,212,810 B2
(45) Date of Patent: Feb. 19, 2019

(54) PRINTED WIRING BOARD AND METHOD OF PRODUCING THE SAME

(71) Applicant: TOPPAN PRINTING CO., LTD., Tokyo (JP)

(72) Inventors: Takanori Ohara, Tokyo (JP); Kyoichi Yamamoto, Tokyo (JP); Kentaro Kubota, Tokyo (JP); Kenji Hayashi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/614,335

(22) Filed: Jun. 5, 2017

(65) Prior Publication Data

US 2017/0273197 A1 Sep. 21, 2017

Related U.S. Application Data

(63) Continuation of application No. PCT/JP2015/003999, filed on Aug. 7, 2015.

(30) Foreign Application Priority Data

Dec. 12, 2014 (JP) ................................ 2014-251947

(51) Int. Cl.
*H05K 1/02* (2006.01)
*H05K 3/12* (2006.01)
*H05K 1/16* (2006.01)
*H05K 1/09* (2006.01)
*H05K 3/10* (2006.01)
(Continued)

(52) U.S. Cl.
CPC ........... *H05K 1/028* (2013.01); *H05K 1/0284* (2013.01); *H05K 1/0386* (2013.01); *H05K 1/092* (2013.01);
(Continued)

(58) Field of Classification Search
CPC .... H05K 1/0277; H05K 1/0278; H05K 1/028; H05K 1/0281; H05K 1/0283; H05K 3/12
See application file for complete search history.

(56) References Cited

U.S. PATENT DOCUMENTS 5,003,693 A 4/1991 Atkinson et al.
2003/0042585 A1 3/2003 Corisis et al.
(Continued)

FOREIGN PATENT DOCUMENTS

JP S64-44605 U 3/1989
JP H02-272793 A 11/1990
(Continued)

OTHER PUBLICATIONS

International Search Report for International Patent Application No. PCT/JP2015/003999 dated Oct. 6, 2015.
(Continued)

*Primary Examiner* — Jeremy C Norris
(74) *Attorney, Agent, or Firm* — Foley & Lardner LLP

(57) ABSTRACT

An ink layer of an electrically conductive ink is formed on a sheet-like base and then the base is bent-deformed before the ink layer is cured, followed by curing the ink layer, thereby forming wiring. The ink layer is pliable during the bending deformation of the base, preventing breakage of the ink layer associated with the bending deformation of the base, and preventing damage to the wiring even when the wiring is finely formed.

10 Claims, 8 Drawing Sheets

(51) Int. Cl.
*H05K 3/20* (2006.01)
*H05K 3/22* (2006.01)
*H05K 3/24* (2006.01)
*H05K 3/32* (2006.01)
*H05K 3/38* (2006.01)
*H05K 3/46* (2006.01)
*H05K 3/00* (2006.01)
*H05K 1/03* (2006.01)
*H05K 3/40* (2006.01)

(52) U.S. Cl.
CPC ............... *H05K 1/095* (2013.01); *H05K 1/16* (2013.01); *H05K 3/0014* (2013.01); *H05K 3/103* (2013.01); *H05K 3/12* (2013.01); *H05K 3/1275* (2013.01); *H05K 3/207* (2013.01); *H05K 3/22* (2013.01); *H05K 3/245* (2013.01); *H05K 3/32* (2013.01); *H05K 3/38* (2013.01); *H05K 3/4664* (2013.01); *H05K 3/4046* (2013.01); *H05K 2201/0293* (2013.01); *H05K 2203/1545* (2013.01); *H05K 2203/302* (2013.01)

(56) References Cited

U.S. PATENT DOCUMENTS

| | | | |
|---|---|---|---|
| 2004/0074671 | A1* | 4/2004 | Hirano .................... G06F 3/045 174/267 |
| 2008/0257006 | A1 | 10/2008 | Durney et al. |
| 2013/0240252 | A1 | 9/2013 | Chen et al. |
| 2014/0160692 | A1 | 6/2014 | Lau |

FOREIGN PATENT DOCUMENTS

| | | |
|---|---|---|
| JP | H05-14490 Y2 | 4/1993 |
| JP | H08-186352 A | 7/1996 |
| JP | 2001-177224 A | 6/2001 |
| JP | 2006-165198 A | 6/2006 |

OTHER PUBLICATIONS

Extended European Search Report dated Jul. 5, 2018 in corresponding application No. 15866751.9.

* cited by examiner

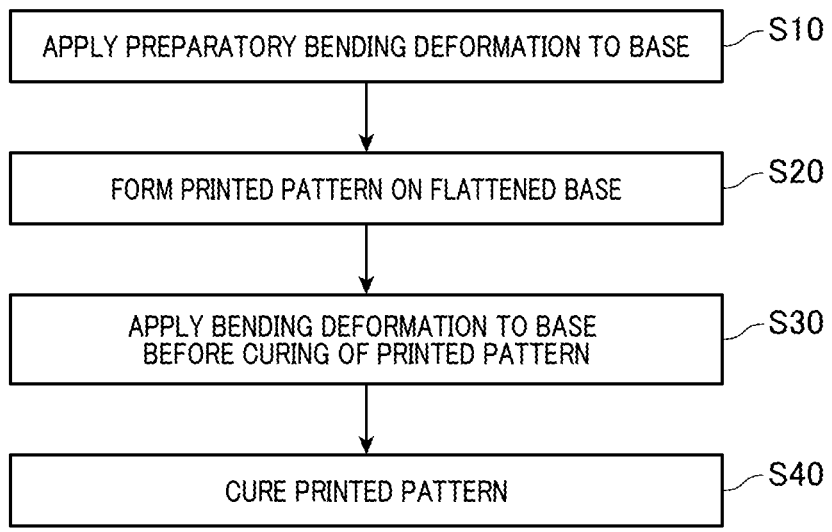
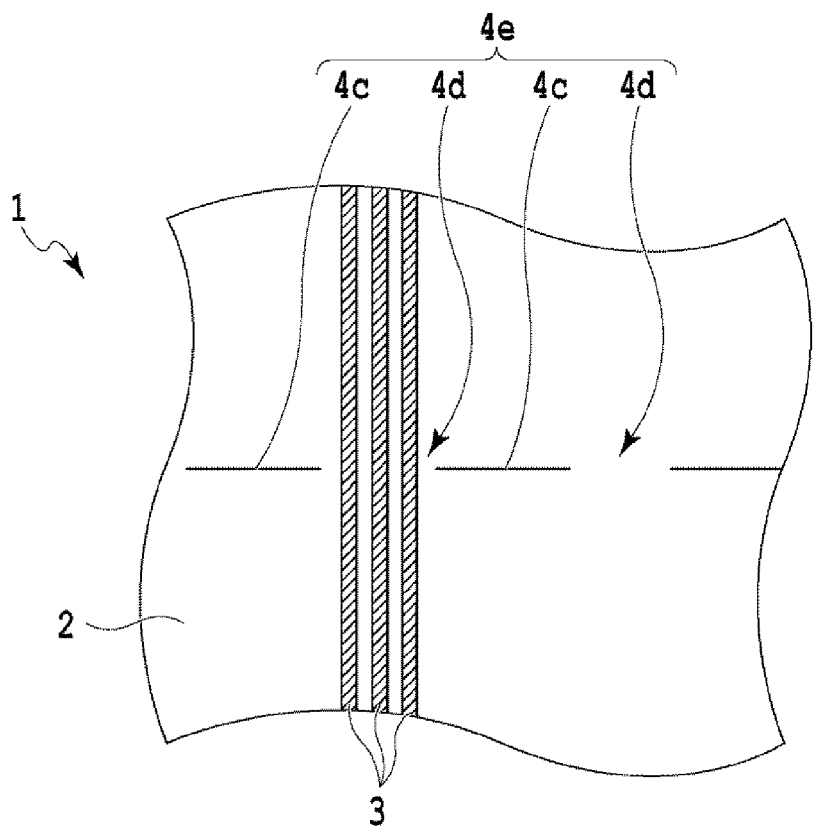

PRINTED WIRING BOARD AND METHOD OF PRODUCING THE SAME

CROSS-REFERENCE TO RELATED PATENT APPLICATIONS

This application is a continuation application filed under 35 U.S.C. § 111(a) claiming the benefit under 35 U.S.C. §§ 120 AND 365(c) of International Application No. PCT/JP2015/003999, filed on Aug. 7, 2015, which is based upon and claims the benefit of priority of Japanese Patent Application No. 2014-251947, filed on Dec. 12, 2014, the entities of which are hereby incorporated by reference.

TECHNICAL FIELD

The present invention relates to a printed wiring board in which wiring is formed by curing an ink layer on a base, and a method of producing the same.

BACKGROUND

In producing a printed wiring board by forming wiring on a base which is three-dimensionally shaped by bending deformation, a complicated procedure is involved in forming the wiring on the three-dimensionally shaped base. A method disclosed in a patent literature (PTL 1) proposes preparing an uncured or half-cured flexible substrate separately from the base. Then, in this method, a copper foil is bonded onto the separately prepared flexible substrate to form wiring, followed by thermocompressively bonding the resultant flexible substrate onto the bent-deformed base.

CITATION LIST

Patent Literature

[PTL 1] JP H02-272793 A

SUMMARY OF THE INVENTION

Technical Problem

When wiring is finely formed, however, the mechanical strength is low, and hence even with the method of PTL 1, the wiring has a high probability of suffering damage, such as cracks or peeling from the base, due to the stress added thereto in bending the flexible substrate.

The present invention has an object to provide a printed wiring board capable of preventing possible damage to the wiring when the wiring is finely formed, and a method of producing the same.

Solution to Problem

One aspect of the present invention is a printed wiring board including a sheet-like base, and wiring formed on the base, characterized in that the wiring is provided by forming one or more ink layers of an electrically conductive ink on the base, followed by bending deformation of the base before the ink layer is cured and further followed by curing the ink layer.

According to the aspect, one or more ink layers of an electrically conductive ink is formed on a sheet-like base, followed by bent-deforming the base before the ink layer is cured and further followed by curing the base, to thereby form wiring. The ink layer therefore is pliable during the bending deformation of the base, preventing breakage of the ink layer associated with the bending deformation of the base, and preventing damage to the wiring even when the wiring is finely formed.

Another aspect of the present invention is characterized in that the base is plastically deformed before the ink layer is formed, and the ink layer is formed in a state where the base is elastically flattened.

According to the aspect, the base 2 elastically restores as it is released from the flattened state, thereby bend-deforming at least part of the base after printing. The bending deformation after printing is assisted in this way, minimizing the need to touch the printed surface of the base 2 during the bending deformation.

Another aspect of the present invention is characterized in that the base includes a bending-facilitated portion for facilitating bending deformation, and the bending deformation is performed at the bending-facilitated portion, and the ink layer extends intersecting the bending-facilitated portion.

According to the aspect, use of the bending-facilitated portion enables easy bending deformation at an exact position, and easy retention of the bent shape. Bending deformation is configured to be performed at the bending-facilitated portion, with the ink layer being configured to extend intersecting the bending-facilitated portion. With this configuration, possible damage to the wiring is suitably prevented because the base is bent-deformed before the ink layer is cured.

It is more preferred that the bending-facilitated portion is served by perforations in which cut portions and connecting portions are alternately arranged, and at least one of the ink layers intersects the perforations at the connecting portion. According to the aspect, the use of perforations can suitably prevent possible damage to the wiring.

Another aspect of the present invention is a printed wiring board including a sheet-like base, and first and second wirings formed on the base, characterized in that: the first and second wirings are each provided by forming an ink layer of an electrically conductive ink, followed by curing of the ink layer; the base includes first and second surfaces, the first surface being formed with the first wiring, the second surface being formed with the second wiring; and a first connecting point of the first wiring and a first connecting point of the second wiring, as well as a second connecting point of the first wiring and a second connecting point of the second wiring, are located at positions corresponding to each other, with the base interposed therebetween.

According to the aspect, a first connecting point of the first wiring and a first connecting point of the second wiring, as well as a second connecting point of the first wiring and a second connecting point of the second wiring, are located at positions corresponding to each other, with the base interposed therebetween. Accordingly, establishment of electrical continuity between the first connecting points and between the second connecting points allows the first and second wirings to cooperate with each other, thereby reducing electrical resistance, enhancing electrical continuity, and increasing redundancy against malfunction or breakage of the wiring.

In the aspect, the base may include at least one opening, and the printed wiring board may further include a connecting strip that interconnects the first wiring and the second wiring through the opening. In this case, the present invention can achieve desired advantageous effects with a simple means.

In the present invention, the base may be removed after the ink layer is formed on the base.

In the present invention, the base is preferably made of paper. Paper is advantageous in that it has high heat resistance, is unlikely to cause cracks in bending, and is relatively easily decomposed after being discarded. It should be noted that the base in the present invention is not limited to paper, but may be made of a resin material, such as PET or PEN, or may be other sheet-like materials, such as non-woven fabric or cloth. Photolithography, which is widely used in forming wiring in general, includes steps of exposing the base to liquid, such as steps of developing and etching a resist, and hence it is difficult to use a material, such as paper, which is not liquid-resistant. In the present embodiment, however, wiring is formed by printing, and hence the steps of exposing the base to liquid can be omitted, and even a material sensitive to liquid can be used as the base.

Another aspect of the present invention is a method of producing a printed wiring board, characterized in that the method includes a step of forming one or more ink layers of an electrically conductive ink on a sheet-like base, a step of applying bending deformation to the base after the ink layer is formed but before the ink layer is cured, to thereby apply bending deformation to at least part of the ink layer, and a step of curing the ink layer after the bending deformation.

Furthermore, it is more preferred that the method further includes a step of plastically deforming the base before the step of forming one or more ink layers, and the step of forming one or more ink layers is performed in a state where the base is elastically flattened.

BRIEF DESCRIPTION OF THE DRAWINGS

FIG. 5 is a flowchart illustrating a producing method, according to the first embodiment.

FIG. 6 is an enlarged view illustrating a relevant part of a modification in which a bending-facilitated portion is served by perforations, according to the first embodiment.

DESCRIPTION OF REPRESENTATIVE EMBODIMENTS

With reference to the drawings, some embodiments of the present invention will be described. FIGS. 1 to 4 show a printed wiring board 1 according to a first embodiment of the present invention, in which wiring 3 is formed by providing one or more ink layers on a base 2 made of paper, by intaglio offset printing. It will be understood that the scope of the invention is not necessarily limited to these representative embodiments. These representative embodiments are illustrative of the invention.

Figure 1:
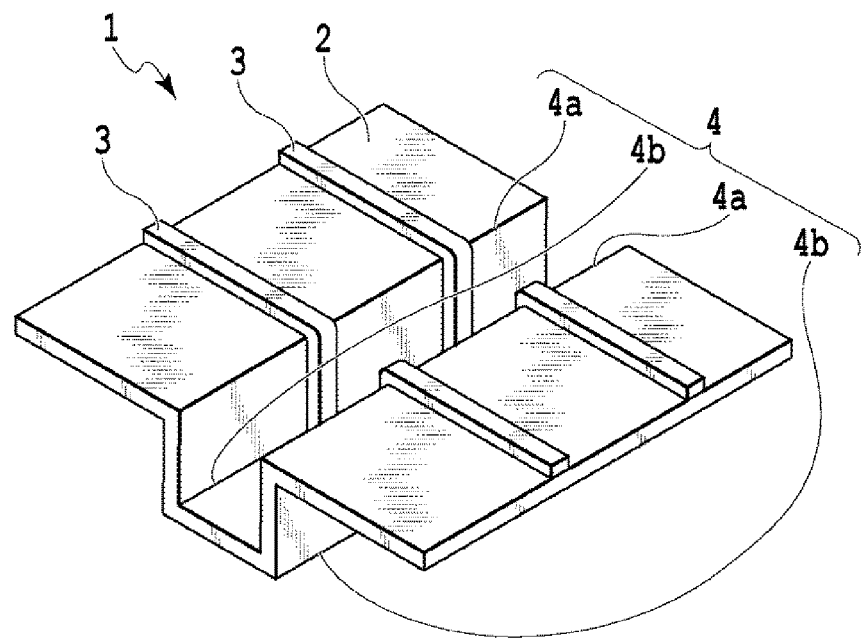
FIG. 1 is a perspective view illustrating a printed wiring board, according to a first embodiment of the present invention.
Figure 2:
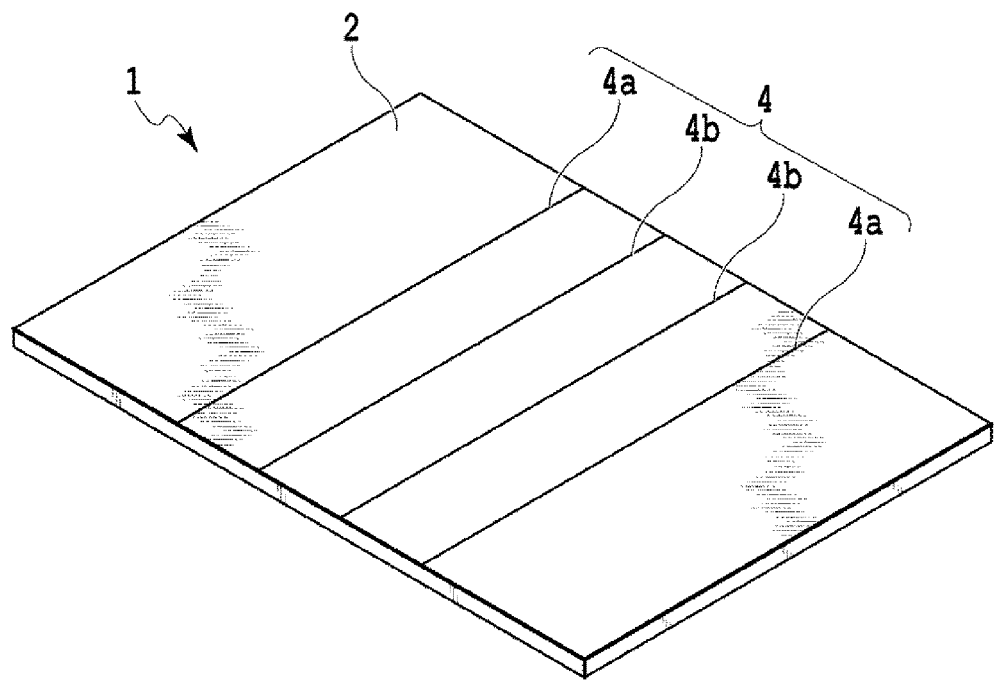
FIG. 2 is a perspective view illustrating a base, according to the first embodiment.

FIG. 1 shows a completed printed wiring board 1. In FIG. 1, the base 2 is made of paper with a thickness of 60 µm, and includes a fold 4. As shown in FIG. 2, the fold 4 includes two mountain-folds 4a and two valley-folds 4b. The fold 4 serves as the bending-facilitated portion of the present invention. The bending-facilitated portion is obtained by processing part of the base 2 to facilitate bending deformation of the base 2.

Means for facilitating bending may be perforations in which, for example, cut portions and connecting portions are alternately arranged in the longitudinal direction. In this case, the cut portions completely or partially penetrate the base 2 in the thickness direction, and the connecting portions correspond to portions where cut portions are not formed. Perforations, when adopted, can decrease the cross-sectional area of the base 2 owing to the cut portion and can facilitate bending deformation. In another configuration, the fold 4 serving as the bending-facilitated portion may be replaced by a pressed portion which is obtained by pressing the base 2 from the front and back surfaces thereof and partially reducing the thickness. The pressed portion, when adopted, can decrease moment of inertia of area owing to the decrease in the thickness of the base 2 and can facilitate bending deformation. Other means for facilitating bending may include shaving-off the base 2 in the thickness direction, or shallowly cutting the base 2 so as not to penetrate therethrough in the thickness direction. The shaving-off or shallow cutting may be applied to a surface of the base 2 where the wiring 3 is not formed, or if applied to a surface where the wiring is formed, connecting portions may be intermittently left as in perforations. A single fold 4 may be configured by a plurality of bending facilitated portions, or in parallel or serially combined several types of bending-facilitated portions.

One or more ink layers are obtained by printing an electrically conductive ink. The ink layers have a line width and a line interval, for example, of 20 µm/20 µm or less, and preferably 10 µm/10 µm or less. The electrically conductive ink to be used, for example, is preferably a silver paste or a copper paste. The electrically conductive ink to be used is preferably made of a material that ensures a time sufficient for bend-deforming the base 2, described below, within a period from printing to curing of the electrically conductive ink. Besides baking, curing may be selected from various means, such as heating, natural drying, ultraviolet curing, and cooling (when using an electrically conductive ink that contains a thermoplastic material). The electrically conductive ink is printed by intaglio offset printing, for example, but may be printed by different printing methods.

Figure 3:
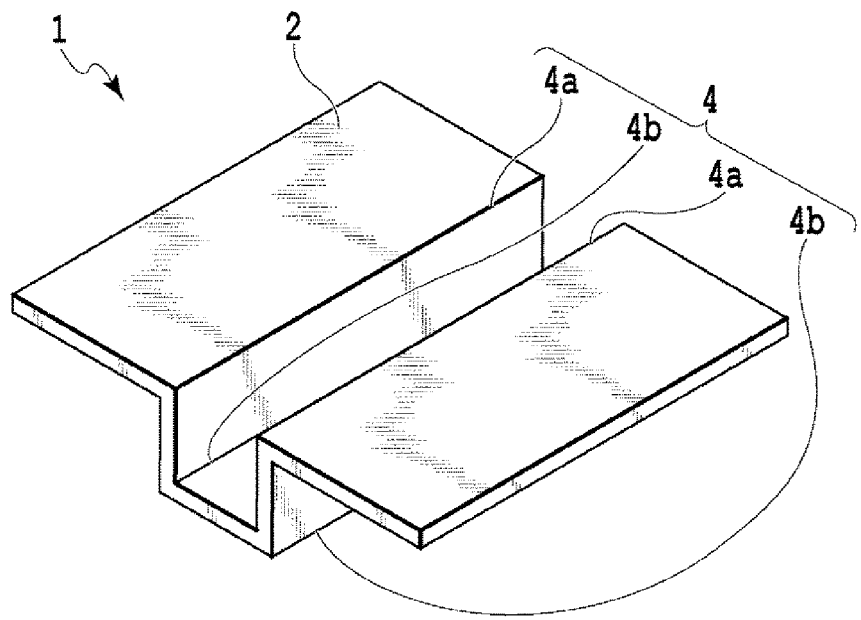
FIG. 3 is a perspective view illustrating the base after being bent-deformed as preparatory processing, according to the first embodiment.

A procedure for producing the printed wiring board 1 of the first embodiment will be described. Referring to FIG. 5, the base 2 is bent-deformed first as preparatory processing (S10). In this preparatory bending deformation, the base 2 is plastically deformed on the fold 4 mechanically or manually, or deformed by pressing using a die. The preparatory bending deformation may be performed together with heating. With the preparatory bending deformation, the base 2 initially flat as in FIG. 2 is deformed into a shape equivalent to a completed shape as shown in FIG. 3 (or a shape analogous to a completed shape rather than a flat shape).

Figure 4:
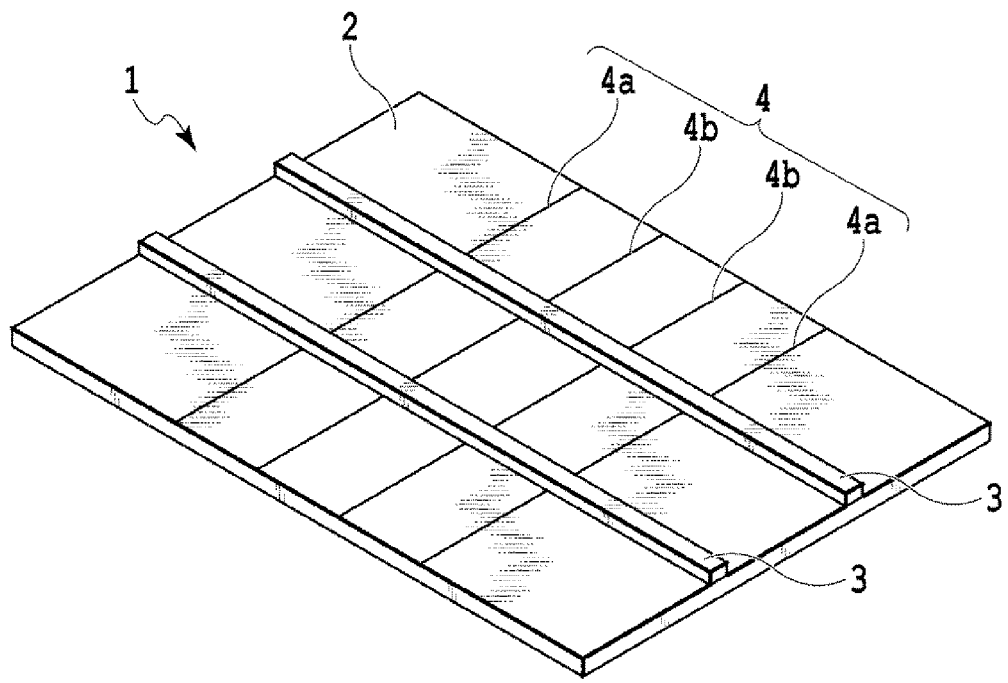
FIG. 4 is a perspective view illustrating the base after formation of an ink layer, according to the first embodiment.

Subsequently, with the base 2 being flattened, one or more ink layers is formed on the base 2 (S20). The base 2 can be held being flatly stretched using an appropriate holding member, such as a frame (not shown). The ink layer can be formed by printing, such as intaglio offset printing. When intaglio offset printing is adopted, a gravure plate used for the printing is obtained by forming a groove, which corresponds to the wiring, in a metal plate, such as a copper or nickel plate, or a glass plate, and forming an abrasion-resistant coating on the surface by chromium or carbon plating. The gravure plate is filled with an electrically conductive ink at a constant speed by doctor blading. Subsequently, the electrically conductive ink on the gravure plate is transferred onto a blanket. The blanket is obtained, for example, by fixing a silicone blanket onto a surface of a substantially cylindrical blanket trunk. Subsequently, the electrically conductive ink on the blanket is pressed against the base 2 for transfer thereto. As shown in FIG. 4, the ink layer (indicated by reference sign 3) is formed on the flattened base 2. Besides the frame, the holding member used may be a clamping means for clamping and holding the end portions of the base 2 with a tension, or a suction means for sucking the base 2 with a negative pressure or the like from behind the base 2.

Subsequently, the base 2 is bent-deformed before the ink layer is cured (S30). At least part of the bending deformation can be performed, with the base 2 released from the holding member that holds the base 2 flat. This eliminates the need to touch portions of the surface of the base 2 where the ink layer is formed, thereby minimizing damage to the wiring. Alternatively, the bending deformation at step S30 may be performed by a means similar to the preparatory bending deformation at step S10, or by a means for holding the base 2 in a shape equivalent to that of a completed shape. As a result of the bending deformation, the base 2 is bent and three-dimensionally deformed into the same shape as the shape shown in FIG. 1.

Lastly, retaining (or holding) the base 2 in the same shape as the completed shape, the ink layer is cured (S40). As mentioned above, this curing can be performed by any means, such as baking, heating, natural drying, ultraviolet curing, or cooling (when using an electrically conductive ink that contains a thermoplastic material), which is suitable for the type and components of the electrically conductive ink to be used. When heating is used for the curing, an infrared heater and a hot-air dryer can be used singly or in combination. In this way, the printed wiring board 1 in a completed shape as shown in FIG. 1 can be obtained.

As described above, in the present embodiment, the wiring 3 is formed by forming one or more ink layers of an electrically conductive ink on the sheet-like base 2, followed by bending deformation of the base 2 before the ink layer is cured and further followed by curing the ink layer. During the bending deformation of the base 2, therefore, the ink layer is in an uncured or half-cured state and thus is pliable. Due to the pliability, breakage is prevented in the bending deformation of the base 2, and possible damage to the wiring 3, even when finely formed, is prevented.

In the present embodiment, the base 2 is plastically deformed before the ink layer is formed, and the ink layer is formed in a state where the base 2 is elastically flattened. Thus, the base 2 is elastically restored as it is released from the flattened state, resultantly performing at least part of the bending deformation. The bending deformation after printing is assisted in this way, minimizing the need to touch the printed surface of the base 2 during the bending deformation after printing.

In the present embodiment, the base 2 includes the bending-facilitated portion (fold 4) for facilitating bending deformation, enabling easy bending deformation at an exact position, and easy retention of the bent shape. Bending deformation is configured to be performed at the bending-facilitated portion, with the ink layer being configured to extend intersecting the bending-facilitated portion. Even with this configuration, possible damage to the wiring 3 is suitably prevented because the base 2 is bent-deformed before the ink layer is cured.

In the present embodiment, the base 2 is made of paper, and hence has heat resistance higher than the one made of a resin material, such as PET (polyethylene terephthalate) or PEN (polyethylene naphthalate). PET or PEN, which have a low glass transition temperature, are only usable with an ink having a low baking temperature, involve difficulty in decreasing the volume resistance, and easily cause cracks when bent-deformed, while being unlikely to decompose, imposing loads on the environment. In contrast to this, paper is advantageous in that it has high heat resistance, is unlikely to cause cracks in bending deformation, and is relatively easily decomposed after being discarded. It should be noted that the base 2 in the present invention is not limited to paper, but may be made of a resin material, such as PET or PEN, or may be other sheet-like materials, such as non-woven fabric or cloth.

Photolithography, which is widely used in forming wiring in general, includes steps of exposing the base to liquid, such as steps of developing and etching a resist, and hence it is difficult to use a material, such as paper, which is not liquid-resistant. In the present embodiment, however, wiring is formed by printing, and hence the steps of exposing the base to liquid can be omitted, and even a material sensitive to liquid can be used as the base.

As shown in FIG. 6, the bending-facilitated portion (fold 4) can be served by perforations 4e in which cut portions 4c and connecting portions 4d are alternately arranged in a longitudinal direction. If at least one of the ink layers (shown by reference sign 3) intersects the perforations 4e at the connecting portion 4d, breakage of the wiring 3 on the fold 4 can be particularly suitably prevented. For example, the cut portion may have a length of 0.3 mm, and the connecting portion 4d may have a length of 0.2 mm. In this case, five wirings 3 each having a width of 10 μm can be disposed at an interval of 10 μm, intersecting the connecting portion 4d even when a margin of 50 μm is provided at both ends of the wiring group. The cut portions 4c may be replaced by pressed portions which are portions of the base pressed in the thickness direction, and the pressed portions may be longitudinally arranged alternating with the connecting portions 4d which are not pressed. In this case as well, at least one of the ink layers is ensured to intersect the fold 4 at the connecting portion 4d.

Figure 7:
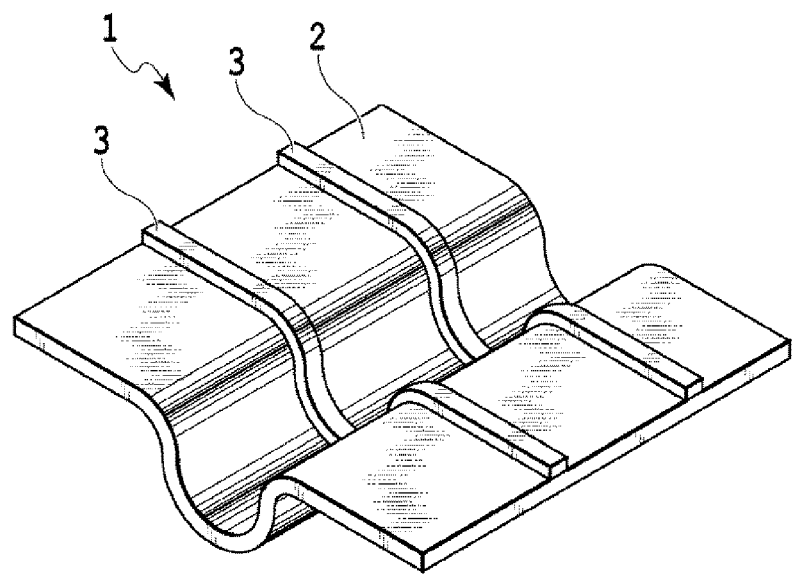
FIG. 7 is a perspective view illustrating a modification in which bending deformation is performed with a relatively large curvature radius, according to the first embodiment.

As shown in FIG. 7, the base 2 may be bent-deformed with a relatively large curvature radius. In this case as well, an ink layer (shown by reference sign 3) is formed on the base 2, followed by bending deformation of the base 2 before the ink layer is cured and further followed by curing the ink layer, thereby preventing possible damage to the wiring. In this case, the fold 4 as the bending-facilitated portion does not have to be necessarily provided, or a plurality of parallel folds 4 may be provided, instead, over the entire region subjected to bending deformation.

Figure 8:
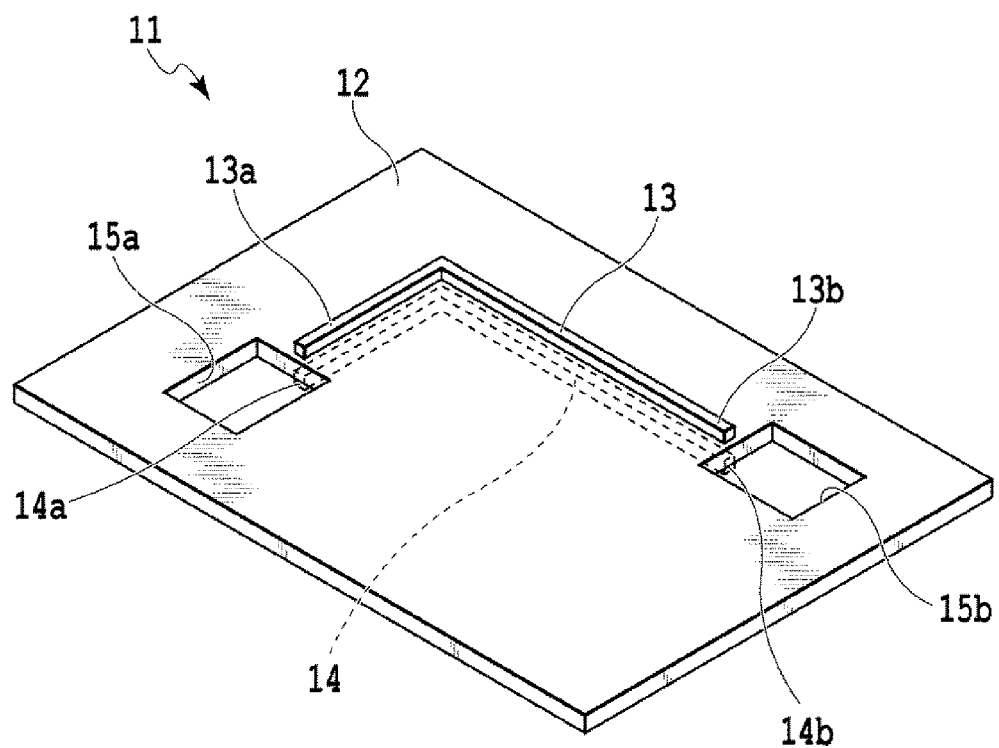
FIG. 8 is a perspective view illustrating a printed wiring board, according to a second embodiment.
Figure 9:
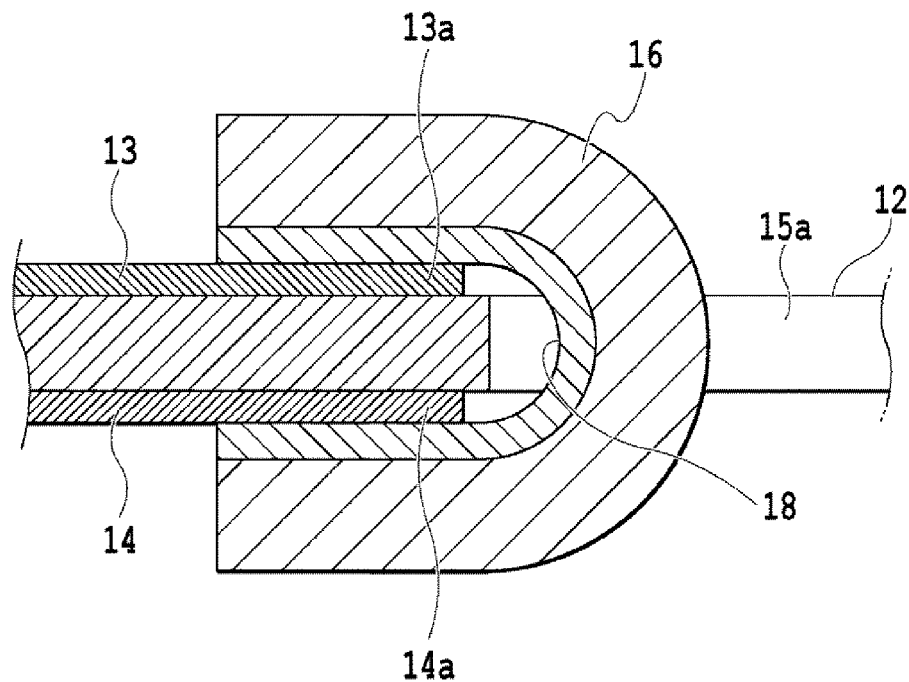
FIG. 9 is a cross-sectional view illustrating a relevant part of the printed wiring board, according to the second embodiment.

The following description sets forth a second embodiment of the present invention. FIGS. 8 and 9 show a printed wiring board 11 according to the second embodiment of the present invention, which is obtained by forming a first wiring 13 and a second wiring 14 on the front and back surfaces, respectively, of a base 12 made of paper.

Qualities of the material of the base 12 and qualities of the material of the first and second wirings 13 and 14 are similar to those of the components of the first embodiment. The first and second wirings 13 and 14 are each obtained by forming an ink layer of an electrically conductive ink, followed by curing the ink layer.

The first and second wirings 13 and 14 are mirror symmetrical, and are formed accordingly at positions corresponding to each other with the base 12 interposed therebetween. In other words, when viewed perpendicularly to the surface of the base 12, the first and second wirings 13 and 14 positionally coincide with each other (overlap each other) in their entirety.

A first connecting point 13*a* of the first wiring 13 and a first connecting point 14*a* of the second wiring 14 are located at positions corresponding to each other with the base 12 interposed therebetween. Likewise, a second connecting point 13*b* of the first wiring 13 and a second connecting point 14*b* of the second wiring 14 are located at positions corresponding to each other with the base 12 interposed therebetween.

The base 12 is provided with openings 15*a* and 15*b*. As shown in FIG. 9, the first connecting point 13*a* of the first wiring 13 and the first connecting point 14*a* of the second wiring 14 are interconnected by a connecting strip 16 that extends through the openings 15*a* and 15*b*. The connecting strip 16 is obtained by forming a wiring 18 of an electrically conductive material, on a surface of a base 17 which is made of a flexible and insulative material, such as paper. The first and second wirings 13 and 14, and the wiring 18 of the connecting strip 16 are formed by printing an ink layer of a material similar to that of the ink layer of the first embodiment, followed by bending deformation of the base 17 before the ink layer is cured, and bringing the wiring 18 of the connecting strip 16 into contact with the first and second wirings 13 and 14, followed by curing the ink layer in that state. The wiring 18 is printed after preparatory bending deformation and elastic flattening of the base 17. Such a method may be replaced by a method of curing the first and second wirings 13 and 14, and the wiring 18 of the connecting strip 16, followed by adhesion of these wirings with an electrically conductive adhesive material (e.g., an electrically conductive paste or an electrically conductive film).

According to the printed wiring board 11 of the second embodiment configured as described above, the first connecting points 13*a* and 14*a* of the first and second wirings 13 and 14, respectively, are located at positions corresponding to each other with the base 12 interposed therebetween. Likewise, the second connecting points 13*b* and 14*b* of the first and second wirings 13 and 14, respectively, are located at positions corresponding to each other with the base 12 interposed therebetween. Accordingly, establishment of electrical continuity between the first connecting points 13*a* and 14*a* and between the second connecting points 13*b* and 14*b* allows the first and second wirings 13 and 14 to cooperate with each other, thereby reducing electrical resistance, enhancing electrical continuity, and increasing redundancy against malfunction or breakage of the wirings.

In the second embodiment, the base 12 is provided with at least one opening 15*a* or 15*b*, and the connecting strip 16 interconnecting the first and second wirings 13 and 14 through the opening 15*a* or 15*b*. Thus, the present invention can achieve desired advantageous effects with a simple configuration.

In the second embodiment, the first and second wirings 13 and 14 are mirror symmetrical. However, the first and second wirings 13 and 14 do not need to be mirror symmetrical (i.e., do not need to be at corresponding positions via the base 12) as long as the first connecting points 13*a* and 14*a* of the respective first and second wirings 13 and 14, as well as the second connecting points 13*b* and 14*b* of the respective first and second wirings 13 and 14, are at corresponding positions, with the base 12 interposed therebetween, or are at least located at positions sufficiently close to establish electrical continuity between the front and back surfaces of the base 12 via a connecting means such as the connecting strip 16.

At least one of the first and second connecting points may be served by a portion other than the end portions of the wiring 13 or 14 (i.e., may be an intermediate portion of the wiring 13 or 14). Three or more connecting points may be provided per pair of wirings. A single connecting strip 16 may be provided with a plurality of parallel wirings 18, so that electrical continuity can be established between the first and second wirings in each of a plurality of pairs of the first and second wirings. At least one opening 15*a* or 15*b* is provided in the second embodiment; however, the opening does not have to be necessarily provided. In that case, it is preferable that the first connecting points 13*a* and 14*a* of the first and second wirings 13 and 14 are provided near an edge portion of the base 12, for example, and interconnected by the connecting strip 16.

Figure 10:
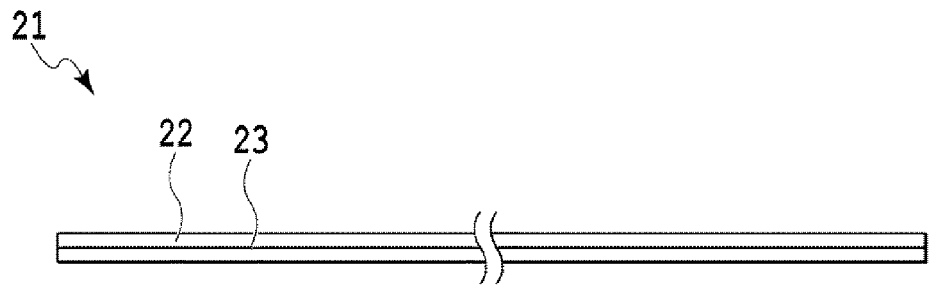
FIG. 10 is a plan view illustrating a printed wiring board, according to a third embodiment.
Figure 11:
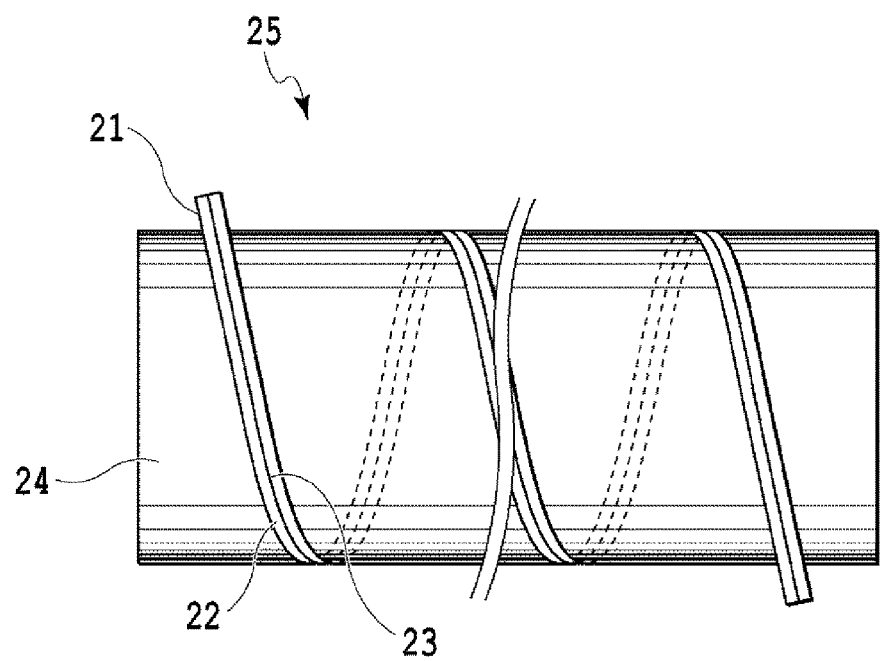
FIG. 11 is a plan view illustrating a paper roll coil configured including the printed wiring board of the third embodiment.

A third embodiment of the present invention will be described. FIGS. 10 and 11 show a printed wiring board 21 according to the third embodiment of the present invention obtained by forming wiring 23 on a surface of a band-like base 22 made of paper. The wiring 23 can be continuously printed by a roll-to-roll method (i.e., method of forming the wiring 23 on a rolled base 22 and taking up the base 22). Qualities of the material of the base 22 and the qualities of the material of the wiring 23 are similar to those of the components of the first embodiment. The wiring 23 is provided by forming an ink layer of an electrically conductive ink, followed by curing the ink layer. The wiring 23 is printed after preparatory bending deformation and elastic flattening of the base 22.

As shown in FIG. 11, the printed wiring board 21 thus formed is wound about a core material 24 having a cylindrical shape and made of paper and adhered thereto, for example, to thereby produce a paper roll coil 25. The printed wiring board 21 may be wound about the core simultaneously with the printing of the ink layer. The ink layer is cured after the base 22 is wound about the core material 24. In this case, to prevent transfer of the ink layer to the base that has been wound, the ink layer is preferably half-cured for evaporation of the solvent in the ink. When winding the printed wiring board 21, adjacent surfaces of the base 22 may be in contact with each other, or may partially or entirely overlap each other.

Figure 12:
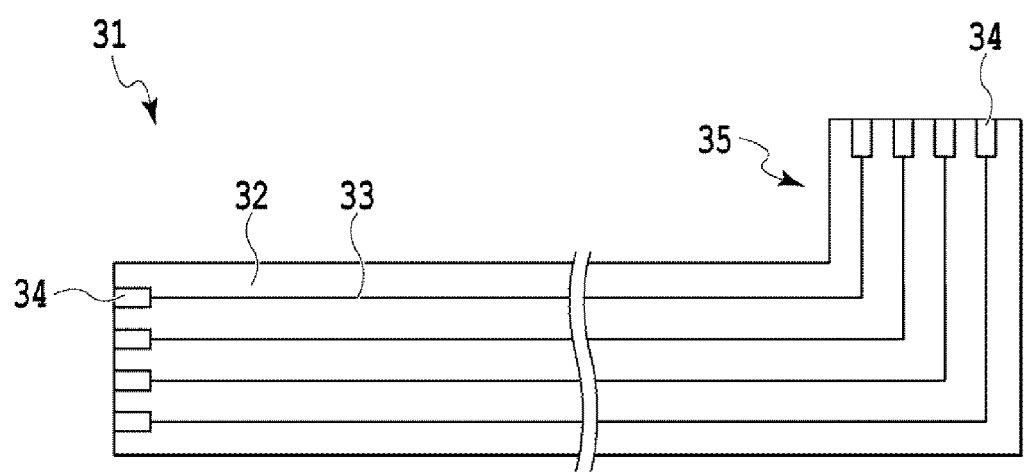
FIG. 12 is a plan view illustrating a printed wiring board, according to a fourth embodiment.
Figure 13:
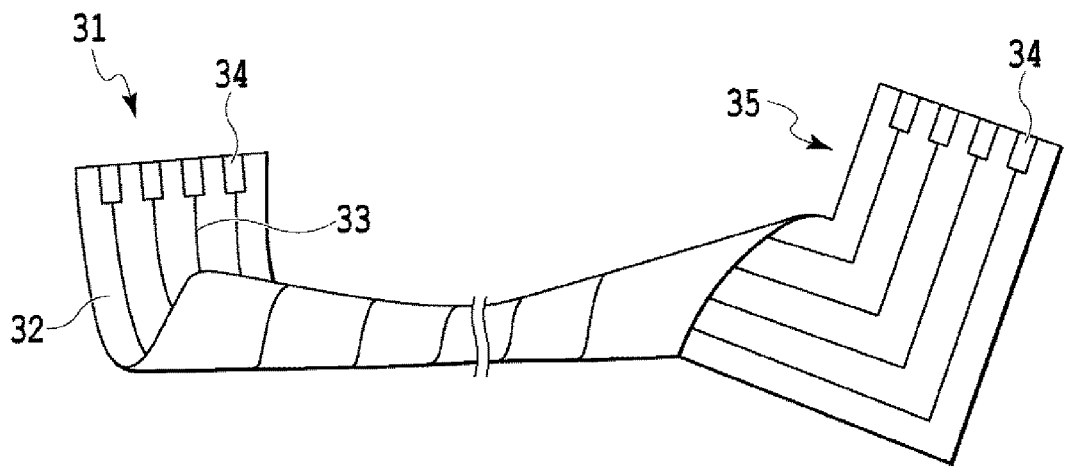
FIG. 13 is a plan view illustrating a paper roll coil configured by deforming the printed wiring board of the fourth embodiment.

A fourth embodiment of the present invention will be described. FIGS. 12 and 13 show a printed wiring board 31 according to the fourth embodiment of the present invention, which is obtained by forming wirings 33 on a surface of a base 32 made of paper. In the present embodiment, four parallel wirings 33 are shown. However, the number of the wirings 33 may be determined as desired. The wirings 33 have a line width and a line interval, for example, of 20 µm/20 µm or less, and preferably 10 µm/10 µm or less. Each wiring 33 has ends both of which are provided with respective lead portions 34 of a suitable width to provide electrical connection. On the right end of FIG. 12, each of the wirings 33 is bent in a direction perpendicular to its longitudinal direction, and the base 32 has a protrusion 35 protruding to a lateral direction relative to its longitudinal direction. Qualities of the material of the base 32 and qualities of the material of the wirings 33 are similar to those of the components of the first embodiment. The wirings 33 are provided by forming an ink layer of an electrically conductive ink, followed by curing the ink layer.

As shown in FIG. 12, the printed wiring board 31 thus formed is spirally bent-deformed in its entirety and processed into a paper roll coil. The wirings 33 can be printed after preparatory bending deformation and elastic flattening of the base 32. In the present embodiment, the ink layer should contact the back surface of the base 32 as the bending deformation proceeds, and therefore the ink layer may be cured before the bending deformation. To fix the bent-deformed state of the printed wiring board 31, the printed wiring board 31 may, for example, be inserted into a tubular casing, or an adhesive agent may be used for fixing it. Successive connection of the lead portion 34 at a first end of a wiring 33 to the lead portion 34 at a second end of the adjacent wiring 33 can create a coil in which all the wirings 33 are connected in series. The wirings 33 can be used as parallel wirings 33 without connecting the adjacent wirings 33. In this case, for example, the volume occupied by the parallel wirings in the device can be reduced.

Figure 14:
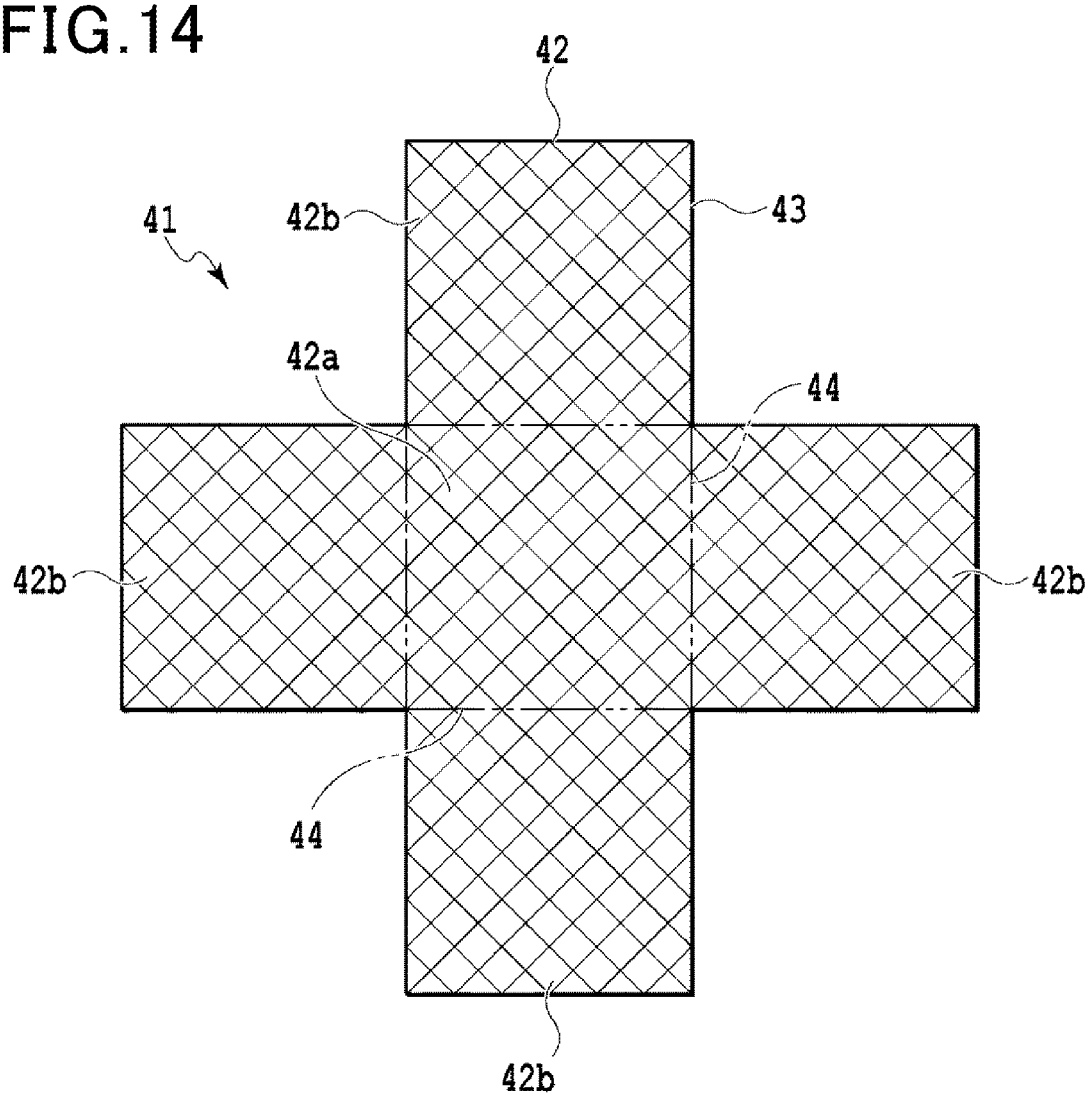
FIG. 14 is a plan view illustrating a base after formation of an ink layer, according to a fifth embodiment.
Figure 15:
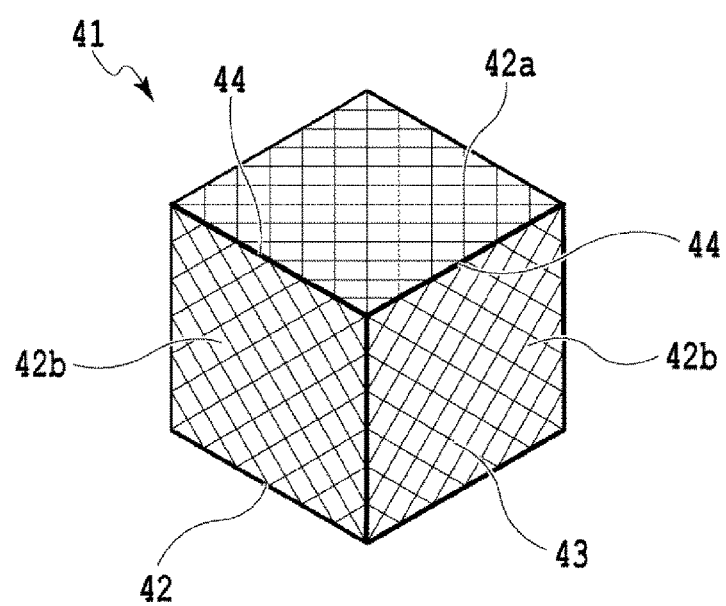
FIG. 15 is a perspective view illustrating a printed wiring board, according to the fifth embodiment.

A fifth embodiment of the present invention will be described. FIGS. 14 and 15 show a printed wiring board 41 according to the fifth embodiment of the present invention, which is obtained by forming wirings 43 on a surface of a base 42 made of paper, bend-deforming the base 42, and removing the base 42. The printed wiring board 41 serves as a filter mounted to an end of piping (not shown) for filtration.

The base 42 has a square center part 42a, and square peripheral parts 42b which are connected to respective four sides of the square center part 42a. A boundary portion between the center part 42a and each peripheral part 42b serves as a mountain-fold 44. The configuration of the fold 44 is similar to that of the fold 4 of the first embodiment. The wirings 33 are formed over the center part 42a and the peripheral parts 42b in their entirety. The direction along which the wirings 33 extend, i.e., the longitudinal direction, forms an angle of 45 degrees relative to each side of the center part 42a and the peripheral parts 42b. However, the wirings 33 may have a different pattern. The number of the wirings 33 may be determined as desired. The wirings 33 have a line width and a line interval, for example, of 20 µm/20 µm or less, and preferably 10 µm/10 µm or less. The material of the wirings 43 is similar to that of the wiring 3 of the first embodiment.

The base 42 can be formed through preparatory bending deformation and elastic flattening, followed by formation of ink layers by printing, for forming the wirings 33. As shown in FIG. 15, the base 42 obtained in this way is bent-deformed by mountain-folding the folds 44 at an angle of 90°. The ink layers can be cured after bending deformation of the base 42 as in the first embodiment. Interconnection of the peripheral parts 42b following the bending deformation is performed before or after the wirings 33 are cured, by printing a material similar to that of the wirings 33 onto each ridge along which two peripheral parts 42b are joined. Alternatively, two peripheral parts 42b can be interconnected via an adhesive material (e.g., an electrically conductive paste or an electrically conductive film) having electrical conductivity similar to or different from that of the wirings 33. If the fluid for which the filter is used has a sufficiently low pressure, the peripheral parts 42b do not have to be interconnected after bending deformation.

Lastly, the base 42 is removed. The base 42 is removed, for example, by using a solvent material, such as N-methylmorpholine, that can dissolve cellulose. The base 42, when made of a water-soluble material such as oblate, is removed by water. Alternatively, the base 42 may be removed by combusting the base 42. A completed filter is obtained through the procedure described above. Besides the quadrangular prism shape, the filter can have any three-dimensional shape, such as a polygonal, hexagonal, or octagonal prism shape, or a columnar shape, a pyramid shape, or a truncated pyramid shape, or any planar shape.

The present invention should not be construed as being limited to the scope of each embodiment described above, but may be modified in design, for example, based on knowledge of those skilled in the art, and the modes after addition of such modifications should also be encompassed by the scope of the present invention. The elements of the present invention can be used in as many combinations as possible. For example, if the wirings can retain their shapes in the absence of the base in the modes of the first to fourth embodiments, the base is removed after completion of the printed wiring board. The method used in the fifth embodiment is used for the removal of the base.

The printed wiring board of the present invention is particularly preferably applied to wiring substrates. Other than wiring substrates, however, the printed wiring board of the present invention is applicable to antennas, electromagnetic wave shields, and the like. Such applications should also be encompassed by the scope of the present invention.

What is claimed is:

1. A printed wiring board comprising:
   a sheet-like base, and
   wiring formed on the base, with the wiring provided by forming one or more ink layers of an electrically conductive ink on the base, followed by bending deformation of the base, wherein the one or more ink layers and a base material of the base are bent and deformed together, before the one or more ink layers are cured, and further followed by curing of the one or more ink layers,
   wherein the wiring is formed in a same shape as the bent and deformed base material after the one or more ink layers are cured.

2. The printed wiring board of claim 1, wherein the base is plastically deformed before the one or more ink layers are formed, and the one or more ink layers are formed in a state where the base is elastically flattened.

3. The printed wiring board of claim 1, wherein
   the base includes a bending-facilitated portion for facilitating bending deformation,
   the bending deformation is performed at the bending-facilitated portion; and
   the one or more ink layers extend intersecting the bending-facilitated portion.

4. The printed wiring board of claim 3, wherein
the bending-facilitated portion is served by perforations in which cut portions and connecting portions are alternately arranged; and
at least one of the one or more ink layers intersects the perforations at the connecting portion.

5. A printed wiring board comprising
a sheet-like base,
first and second wirings formed on the base, with the first and the second wirings each being provided by forming an ink layer of an electrically conductive ink, followed by curing of the ink layer;
wherein the base includes first and second surfaces, the first surface being formed with the first wiring, the second surface being formed with the second wiring; and
a first connecting point of the first wiring and a first connecting point of the second wiring, as well as a second connecting point of the first wiring and a second connecting point of the second wiring, the first points and the second point being respectively located at positions corresponding to each other, with the base interposed therebetween.

6. The printed wiring board of claim 5, wherein the base includes at least one opening, and the printed wiring board further includes a connecting strip that interconnects the first wiring and the second wiring through the opening.

7. The printed wiring board of claim 1, wherein the base is removed after the one or more ink layers are formed on the base.

8. The printed wiring board of claim 1, wherein the base is made of paper.

9. A method of producing a printed wiring board, comprising:
a step of forming one or more ink layers of an electrically conductive ink on a sheet-like base;
a step of applying bending deformation to the base after the one or more ink layers are formed but before the one or more ink layers are cured, to thereby apply bending deformation to at least part of the one or more ink layers; and
a step of curing the one or more ink layers after the bending deformation.

10. The method of producing a printed wiring board of claim 9, further comprising:
a step of plastically deforming the base before the step of forming the one or more ink layers; and
wherein the step of forming the one or more ink layers is performed in a state where the base is elastically flattened.

* * * * *